(12) United States Patent
Aggarwal et al.

(10) Patent No.: US 6,883,250 B1
(45) Date of Patent: Apr. 26, 2005

(54) NON-CONTACT COOL-DOWN STATION FOR WAFERS

(75) Inventors: Ravinder Aggarwal, Gilbert, AZ (US); Bob Haro, Gilbert, AZ (US)

(73) Assignee: ASM America, Inc., Phoenix, AZ (US)

( * ) Notice: Subject to any disclaimer, the term of this patent is extended or adjusted under 35 U.S.C. 154(b) by 0 days.

(21) Appl. No.: 10/701,681

(22) Filed: Nov. 4, 2003

(51) Int. Cl.$^7$ .............................. F26B 7/00; F25D 25/00
(52) U.S. Cl. .............................. 34/433; 62/62; 117/728
(58) Field of Search .......................... 62/62; 118/500, 118/724, 725, 728; 437/228; 34/391, 433

(56) References Cited

U.S. PATENT DOCUMENTS

| | | | |
|---|---|---|---|
| 3,961,120 A | * | 6/1976 | Hearn et al. ................. 428/210 |
| 4,148,575 A | | 4/1979 | Siryj |
| 4,566,726 A | | 1/1986 | Correnti et al. |
| 4,622,918 A | | 11/1986 | Bok |
| 4,828,224 A | | 5/1989 | Crabb et al. |
| 4,860,687 A | | 8/1989 | Frijlink |
| 4,951,601 A | | 8/1990 | Maydan et al. |
| 4,987,856 A | | 1/1991 | Hey et al. |
| 4,990,047 A | | 2/1991 | Wagner et al. |
| 5,080,549 A | | 1/1992 | Goodwin et al. |
| 5,094,013 A | * | 3/1992 | Martin et al. ................... 34/62 |
| 5,135,349 A | | 8/1992 | Lorenz et al. |
| 5,178,639 A | | 1/1993 | Nishi |
| 5,180,273 A | | 1/1993 | Sakaya et al. |
| 5,241,758 A | | 9/1993 | Cruz et al. |
| 5,281,320 A | | 1/1994 | Turner et al. |
| 5,320,982 A | * | 6/1994 | Tsubone et al. ............. 438/714 |
| 5,407,449 A | | 4/1995 | Zinger |
| 5,445,677 A | * | 8/1995 | Kawata et al. ............... 118/724 |
| 5,458,687 A | * | 10/1995 | Shichida et al. ............. 118/724 |
| 5,464,313 A | | 11/1995 | Ohsawa |
| 5,855,465 A | | 1/1999 | Boitnott et al. |
| 5,855,681 A | | 1/1999 | Maydan et al. |
| 5,863,170 A | | 1/1999 | Boitnott et al. |
| 5,911,461 A | | 6/1999 | Sauter et al. |
| 5,974,682 A | | 11/1999 | Akimoto |
| 6,068,089 A | | 5/2000 | Brooks et al. |
| 6,073,366 A | | 6/2000 | Aswad |
| 6,097,005 A | | 8/2000 | Akimoto |
| 6,111,225 A | | 8/2000 | Ohkase et al. |
| 6,183,183 B1 | | 2/2001 | Goodwin et al. |
| 6,183,565 B1 | * | 2/2001 | Granneman et al. ......... 118/725 |

(Continued)

FOREIGN PATENT DOCUMENTS

DE  3608783  9/1987

(Continued)

*Primary Examiner*—William C. Doerrler
(74) *Attorney, Agent, or Firm*—Knobbe, Martens, Olson & Bear, LLP

(57) ABSTRACT

A stationary cooling station for cooling wafers after the wafers have been subjected to semiconductor processing supports the wafer by flowing gas in accordance with the Bernoulli principle. An upper wall of the cooling station contains a plurality of gas outlets that direct gas to flow over the top surface of the wafer. In this way, a low-pressure region is created over the wafer and the wafer is suspended within the cooling station, without directly contacting any surface for support. In addition to providing lift for the wafer, the gas is a thermally conductive gas that can cool the wafer by conducting heat away from it.

17 Claims, 7 Drawing Sheets

U.S. PATENT DOCUMENTS

| | | |
|---|---|---|
| 6,203,622 B1 * | 3/2001 | Halpin et al. ............... 118/730 |
| 6,209,220 B1 * | 4/2001 | Raaijmakers ................. 34/66 |
| 6,215,106 B1 | 4/2001 | Boas et al. |
| 6,242,718 B1 * | 6/2001 | Ferro et al. ................ 219/405 |
| 6,285,102 B1 | 9/2001 | Matsuoka et al. |
| 6,408,537 B1 * | 6/2002 | Aswad ....................... 34/380 |
| 6,443,168 B1 * | 9/2002 | Morita et al. .............. 134/105 |
| 2004/0092128 A1 * | 5/2004 | Grant et al. ............... 438/745 |

FOREIGN PATENT DOCUMENTS

| | | |
|---|---|---|
| EP | 0 829 904 | 3/1998 |
| JP | 2001-250788 | 12/2000 |
| WO | WO 90/13687 | 11/1990 |
| WO | WO 98/01890 | 1/1998 |
| WO | WO99/03138 * | 1/1999 |
| WO | WO 99/03138 | 1/1999 |

* cited by examiner

NON-CONTACT COOL-DOWN STATION FOR WAFERS

FIELD OF THE INVENTION

This invention relates generally to semiconductor fabrication and, more particularly, to an apparatus and a method for cooling a substrate at a cool-down station.

BACKGROUND OF THE INVENTION

Semiconductor wafers or other such substrates are subjected to very high processing temperatures. For example, in high temperature epitaxial chemical vapor deposition (CVD), the temperatures can approach 1200° C., while low temperature epitaxy is conducted between about 400° C. and 900° C. In a typical cycle, using one or more robotic wafer handlers, a wafer is transferred from a room temperature cassette either directly, or via one or more loadlock and transfer chambers, into a processing or reaction chamber where the wafer is subjected to high temperature processing. The wafer is then transferred using one or more wafer handlers from the high temperature processing chamber back to the same cassette or a separate cassette for processed wafers, either directly from the processing chamber or via the loadlock and transfer chambers.

Because of the high temperature CVD processing, transport of the wafer from the process chamber immediately to, e.g., a wafer cassette is not possible due to the temperature of the wafer exceeding the limits of heat resistance of the materials commonly used in the cassettes. At these temperatures, the cassettes may be damaged and the structural integrity of the cassette may be undermined. Because of this, transfer of the wafer to the cassette must be postponed until the wafer temperature falls below the limits of the thermal materials properties of the cassette material. While cassettes are available that can handle wafers as hot as 170° C., they are relatively expensive. A commonly available and less expensive cassette made of Delrin® can only handle temperatures well below 100° C. Other commonly available units can only accomodate wafer temperatures of about 60° C.

Similarly, transfer of the wafers to a loadlock chamber immediately after high temperature processing is not possible because the temperature of a just-processed wafer may exceed the limits of the heat resistance of materials typically used to support the wafers in a loadlock. As such, the structural integrity of the wafer support devices in the loadlock chamber may be undermined and the loadlock may be damaged. Consequently, it is necessary to cool the temperature of the wafer to levels suitable for contact with the surfaces of a cassette or a loadlock.

Because wafer handling and processing typically occur in an enclosed and carefully controlled environment, there are three principle locations or points during the cycle where the cooling of the wafer might occur: the wafer could be cooled on the susceptor on which it is supported in the process chamber, on the wafer handling device, or off-line at some location within the apparatus between the process chamber and the cassette or loadlock. Cooling the wafer on the susceptor is not cost-effective, however, because the process chamber is then unavailable for processing another wafer, thereby reducing the system wafer throughput. This approach is particularly unattractive because it is then necessary to incur the delay and cost of reheating the wafer support structure or the chamber generally (in the case of hot wall chambers). Removing a wafer while it is hot and cooling it on the wafer handling device is better, but also not cost effective because the delay in loading the next wafer slated for processing also compromises throughput, or requires additional wafer handling equipment and room for accommodating the same. Such impediments increase the per-wafer cost, making these approaches financially unattractive to end users. Because of the high cost of semiconductor wafer processing equipment, it is, of course, critically important from a competitive standpoint to be able to keep this expensive processing equipment in continued use so as to increase the throughput. At the same time, the wafer cooling technique employed must be compatible with the environment of the CVD processing apparatus so as not to adversely affect stringent cleanliness requirements. Also, the cost of the technique must itself be sufficiently moderate so that there is a net reduction in per-wafer costs.

Use of off-line cooling chambers for cooling a wafer can be more efficient, since the susceptor and wafer handling device are not occupied by the wafer being cooled. In conventional cooling chambers, a wafer is positioned on pins in the chamber and cooled by conduction or convection, e.g., by flowing cooling gases over the surfaces of the wafer. Because of the high temperature of the wafer, these pins are typically constructed of quartz or silicon carbide. This approach to cooling wafers also has drawbacks, however, as the relatively hard pins can damage and leave scratches on the backside, or bottom surface, of the wafers by the force of the wafers being placed upon the pins. In addition, contraction of a wafer while it cools on the pins can further scratch the wafer.

Accordingly, it is an object of this invention to provide an improved system for quickly cooling wafer-like substrates to a temperature that will allow the use of low cost commonly available cassettes, while not causing damage to the bottom surface of the wafer.

SUMMARY OF THE INVENTION

In accordance with one preferred embodiment of the invention, a system is provided for high temperature semiconductor processing. The system comprises a semiconductor substrate, a high temperature processing chamber and a substrate handling chamber having a port for moving the substrate into or out of the processing chamber and also a port for moving the substrate to and from a storage area into or out of the handling chamber. The system also includes an automatic substrate handler in the handling chamber for transporting the substrate to and from the storage area and into and out of the process chamber. Also included in the system is a cooling station into which the substrate handler can move the substrate to cool the substrate after processing and before returning the substrate to the storage area. The substrate is supported in the cooling station without a bottom surface or a top surface of the substrate contacting a cooling station surface at any time. The cooling station is configured to support the substrate by emitting a gas in accordance with the Bernoulli principle.

In accordance with another preferred embodiment, a semiconductor wafer holding station is provided for holding semiconductor wafers. The wafer holding station comprises a ceiling and a floor defining a wafer space therebetween for accommodating a wafer. The wafer holding station also comprises a stationary gas outlet assembly operating in accordance with Bernoulli's principle. The gas outlet assembly has a plate that comprises a first axis extending forwardly and rearwardly along a horizontal surface of the plate. A first plurality of outlets is provided in the plate on one side of the first axis for exhausting gas received by the assembly into the wafer space and for establishing a plurality of streams of gas flow toward a perimeter of the wafer upon retention of the wafer. A second plurality of outlets is also provided in the plate on another side of the first axis for exhausting the gas received by the assembly into the wafer space and for establishing a plurality of streams of gas flow toward the perimeter of the wafer upon retention of the wafer. A central outlet disposed generally coincident with the first axis is also provided in the plate for exhausting the gas received by the gas outlet assembly and for establishing a flow of gas intermediate the plurality of streams of gas flow emanating from the first and second plurality of outlets upon retention of the wafer. The gas outlets are configured to exhaust the gas at an angle and direction to create a low pressure zone adjacent the wafer.

In accordance with yet another preferred embodiment of the invention, a semiconductor wafer cooling station is provided. The cooling station comprises an upper horizontal surface and a lower horizontal surface. The upper horizontal surface and the lower horizontal surface define a wafer space configured to accommodate a semiconductor wafer. The cooling station also comprises an immobile cooling assembly having a plurality of gas outlets configured to exhaust a gas onto a face of the wafer. The cooling assembly is configured to suspend the wafer by the Bernoulli principle utilizing the plurality of gas outlets, with all faces of the wafer vertically separated from the upper and the lower horizontal surfaces.

In accordance with another preferred embodiment of the invention, a method is provided for cooling a hot substrate that has been subjected to high temperatures in a chamber. The method comprises removing the hot substrate from the chamber with a substrate handler and transferring the hot substrate into a stationary cooling station using the substrate handler. The substrate is vertically suspended inside the cooling station in accordance with the Bernoulli principle by flowing a gas to create a low pressure zone across a horizontal surface of the substrate. The handler is withdrawn from the cooling station and the substrate is convectively cooled by flowing the gas across the substrate's horizontal surface.

In accordance with another preferred embodiment of the invention, a method is provided for semiconductor processing. The method comprises subjecting a substrate to high temperature processing in a process chamber and providing a substrate handler capable of transporting substrates into and out of the process chamber. The substrate is withdrawn from the process chamber using the substrate handler after subjecting the substrate to high temperature processing. Subsequently, the hot substrate is transported by the handler into a cooling station and aligned with a plurality of gas outlets in the cooling station. The handler is removed from the cooling station and the substrate is supported in the cooling station only by flowing a gas out of the gas outlets and across the substrate. The method further comprises removing the substrate from the cooling station.

BRIEF DESCRIPTION OF THE FIGURES

The invention will be better understood from the detailed description of the preferred embodiments and from the appended drawings, which are meant to illustrate and not to limit the invention, and wherein.

DETAILED DESCRIPTION OF THE PREFERRED EMBODIMENTS

In the illustrated embodiments, a wafer station is provided in which a semiconductor wafer or substrate is held suspended by gas flowing across a major surface of the substrate in accordance with Bernoulli's principle. By this flow of gas, the substrate can be suspended without a horizontal surface of the substrate contacting another surface for vertical support. Advantageously, the wafer station can be used as a cooling station to cool substrates after undergoing semiconductor processing. In such an arrangement, the gas flowing across the major surface can be a cooling gas that cools the substrate as it flows across the major surface. In other arrangements, the wafer station can be used as a staging area to temporarily hold a wafer before the wafer is transported elsewhere.

In suspending the substrate by taking advantage of the Bernoulli principle, the wafer station operates in a manner similar to a class of semiconductor pick-up devices called Bernoulli wands. Bernoulli wands are shown in U.S. Pat. Nos. 5,080,549 and 6,183,183 B1, both to Goodwin, et al., the disclosures of which are herein incorporated by reference in their entirety. In particular, jets of gas are flowed from gas outlets in the wafer station at angles toward the substrate to create a region of low pressure above the substrate, therefore lifting it in arrangements in which the gas outlets are located above the substrate. The weight of the substrate and the pressure of gas exiting the gas outlets provide countervailing forces that advantageously prevent the substrate from being draw into contact with the gas outlets. An advantage of such a wafer station is that the substrate need not contact surfaces of the wafer station, except perhaps at one or more small locations at the side of the substrate, where the substrate can touch pins that help to center the substrate under the gas outlets. In other arrangements, the gas outlets can also be located beneath the substrate, as the gas flowing out of the gas outlets can generate sufficient pressure to suspend the substrate over the gas outlets while maintaining a low pressure zone under the wafer to prevent the wafer from skating off the station. The gas can be any gas compatible for use in semiconductor processing systems, although, preferably, in arrangements for cooling the substrate, the gas is a highly thermally conductive inert gas.

Reference will now be made to the Figures, wherein like numerals refer to like parts throughout.

Figure 1:
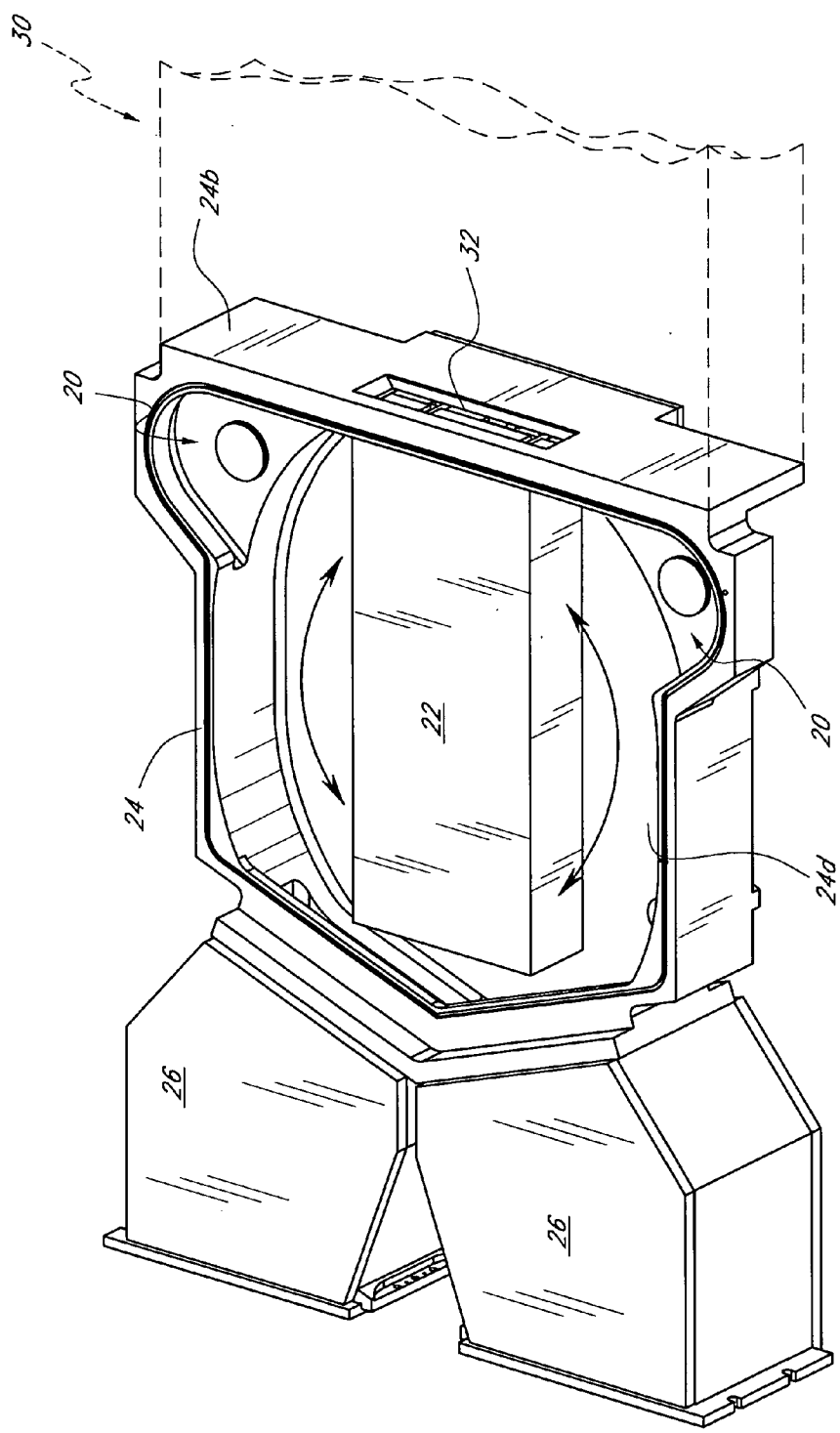
FIG. 1 is a perspective, schematic view of a wafer handling chamber and adjacent portions of a CVD apparatus, in accordance with preferred embodiments of the invention.
Figure 2:
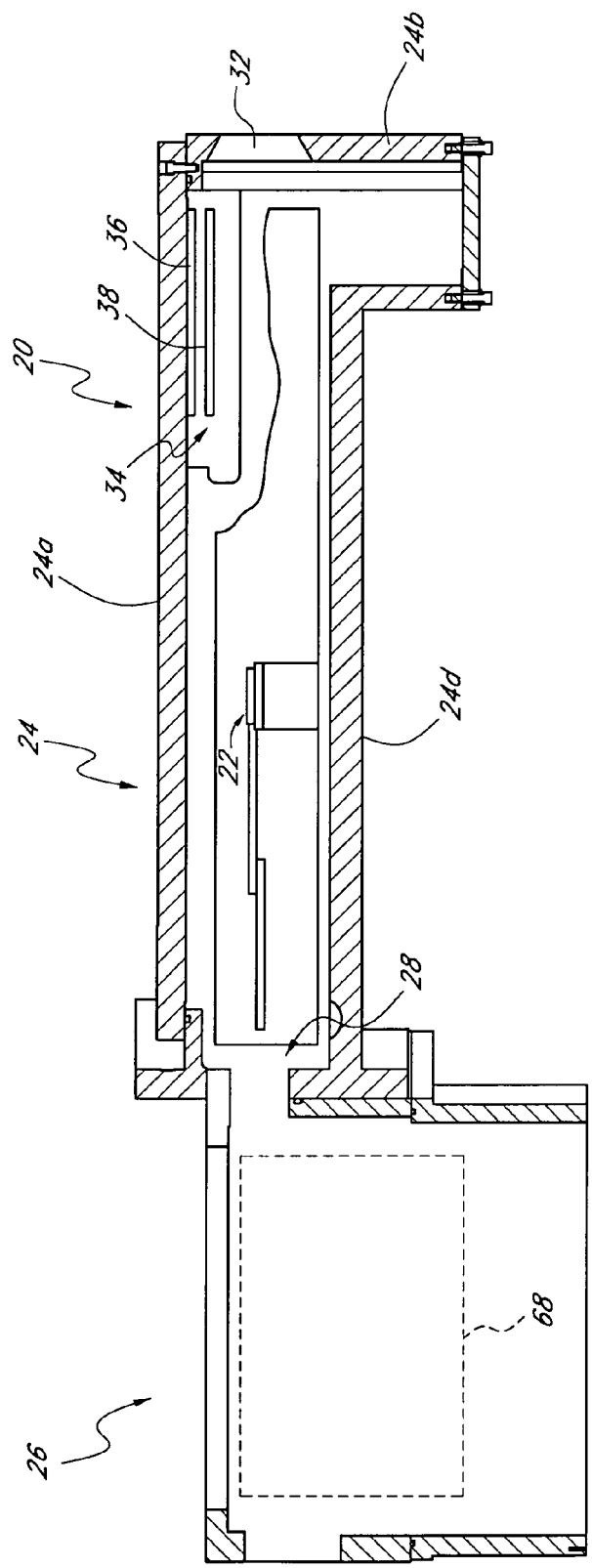
FIG. 2 is a cross-sectional view of the wafer handling chamber and wafer input or output chambers of FIG. 1.

FIGS. 1 and 2 illustrate a portion of a chemical vapor deposition (CVD) apparatus in which wafer station 20 can be housed, in some preferred embodiments of the invention.

The CVD apparatus includes a schematically illustrated automatic or robotic wafer handler 22 centrally positioned within a handling chamber 24. The chamber upper wall 24a is schematically shown in FIG. 2, but is not shown in FIG. 1 so as to illustrate internal components in the chamber 24. The handling chamber 24 is connected to load/unload chambers 26 by way of one or more load/unload ports 28. FIG. 1 illustrates an arrangement in which one chamber 26 functions as a load chamber and another chamber 26 functions as an unload chamber. Either may be referred to as a storage area. FIG. 2 shows a single one of those chambers 26. Many systems utilize a single chamber 26 from which a wafer is withdrawn for processing and is then returned after processing. The handling chamber 24 is further connected to a processing chamber 30, schematically illustrated in FIG. 1, by way of a processing port 32 through a sidewall 24b of the handling chamber 24. Gates or valves are normally provided for the load/unload port 28 and the processing port 32, but these are not shown for purposes of simplicity.

In accordance with preferred embodiments of the invention, there is provided at least one wafer station 20 in one portion of the wafer handling chamber 24 adjacent the process chamber 30. The wafer station 20 is preferably positioned out of the path of the handler so as not to interfere with movement and rotation of the handler 22. Thus, a substrate can be moved out of the process chamber 30 and cooled while another substrate is moved from one of the chambers 26 into the process chamber 30 for processing. In the illustrated embodiment, a second wafer station 20 is also provided on the other side of the processing port 32 adjacent the wall 24b leading to the process chamber 30. In this arrangement, the wafer handler can move a substrate from one of the chambers 26 to the process chamber 30 while one or both of the wafer stations 20 are occupied with a substrate. Advantageously, these arrangements can increase throughput by minimizing periods when the process chamber 30 is not actively processing a substrate.

With reference to FIG. 2, each wafer station 20 has a wafer space 34 which is sized to receive one wafer in a horizontal position, and the wafer station is preferably open to the area of the handling chamber 24 in which the wafer handler 22 is positioned so that wafers may be moved into and out of the wafer station 20 by the handler 22. Preferably, as part of the cooling station control system, a sensor (not shown) is used to detect the presence or absence of wafers 38 in the cooling station 20. In addition to being able to temporarily hold a wafer (i.e., as a staging area), each wafer station 20 preferably also functions as a wafer cooling station for cooling wafers after the wafers have, e.g., undergone semiconductor processing. Each cooling station 20 includes a gas outlet assembly 36, as seen in FIG. 2. It should be noted that while the gas outlet assembly 36 is illustrated located above the wafer 38, in other embodiments the assembly 36 can be located below the wafer 38.

With reference to FIGS. 3A, 3B, 3C and 4, the gas outlet assembly 36 preferably includes a plate 41 and a base 40 having a gas inlet 42 that is connected to a suitable source of gas (not shown). Preferably, as illustrated, the gas inlet 42 is centrally located with respect to the base 40 to provide for a uniform flow of gas to the gas outlets 44. While illustrated as having a disc-shaped base 40 and plate 41 standing out from the ceiling of the cooling station 24, it will be appreciated that the gas outlet assembly 36 need not have a disc-shaped base 40 or plate 41. Rather, the gas outlet assembly 36 can be part of any surface of the cooling station 24 facing the central region of the station and can have any shape, so long as the surface comprises gas outlets 44 oriented to allow gas to flow across the wafer 38 for enabling the Bernoulli principle to be used to suspend the wafer 38 in the cooling station 20, as discussed in greater detail below with respect to FIG. 4.

Figure 3A:
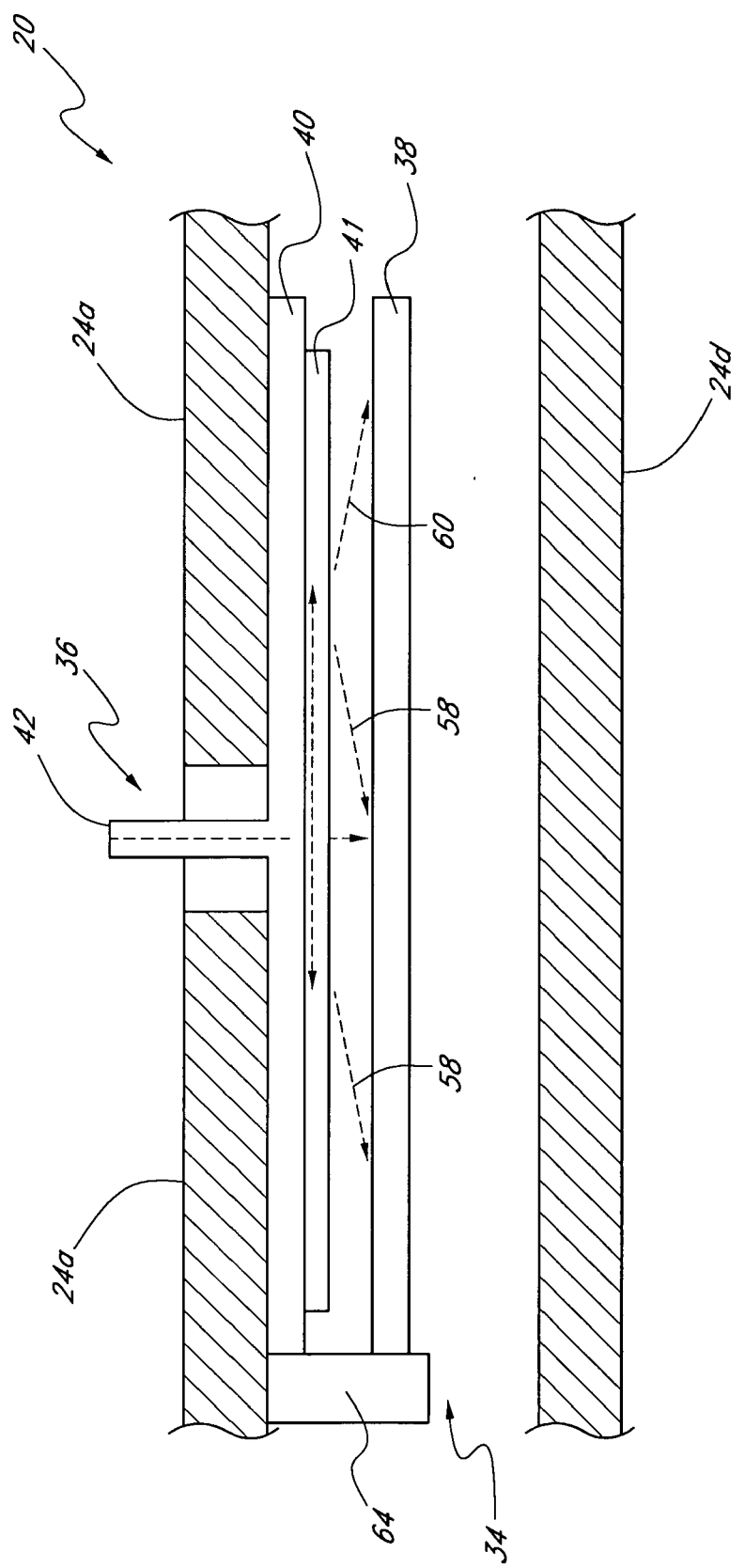
FIGS. 3A, 3B and 3C are schematic, cross-sectional views of a wafer station, in accordance with preferred embodiments of the invention.
Figure 3B:
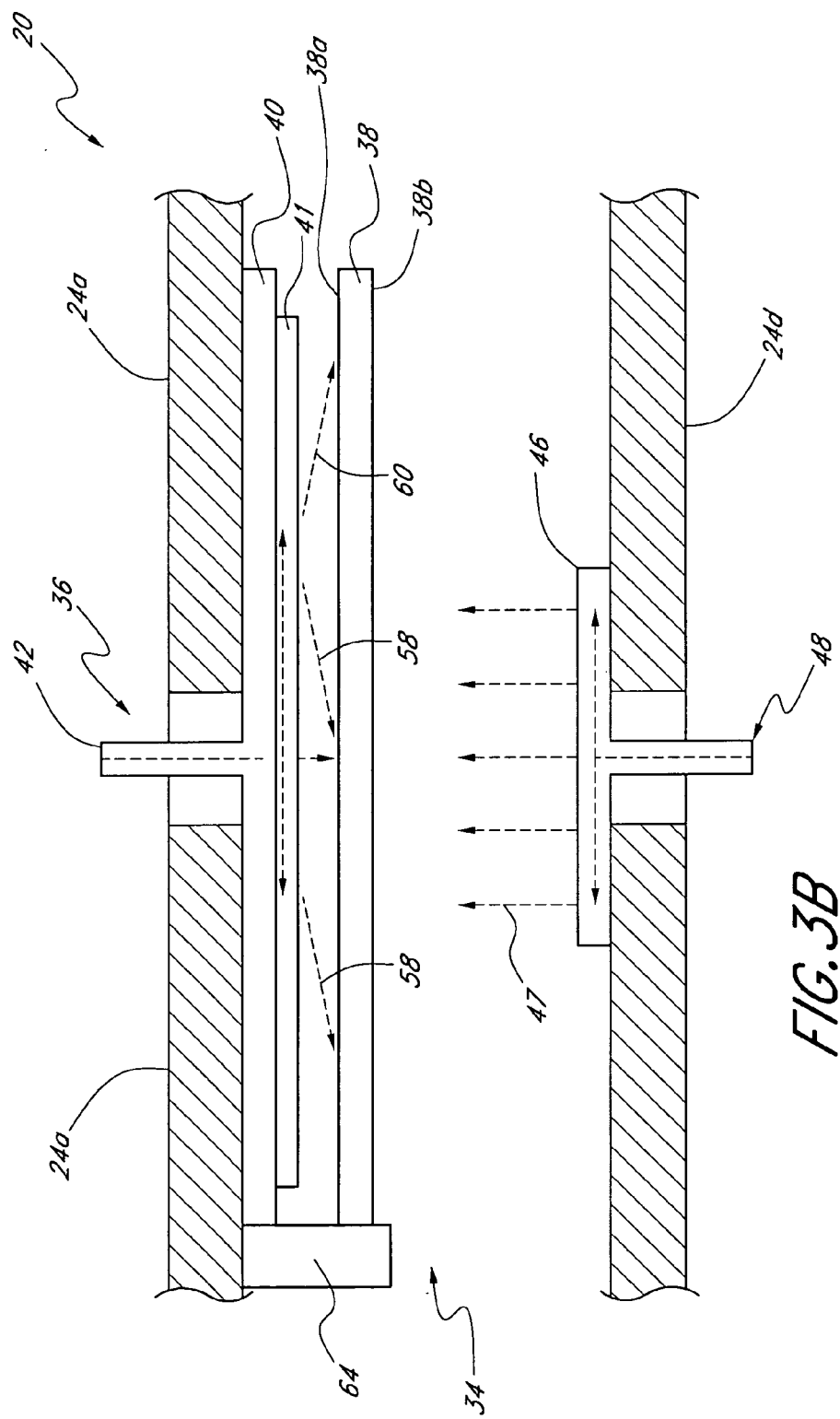

With reference to FIG. 3A, it can be seen that the cooling station 20 can include a single gas outlet assembly 36 to both cool and to discharge gas to lift the substrate 38 by the Bernoulli principle. In other embodiments, cooling of the substrate 38 is augmented by other means. For example, as illustrated in FIG. 3B, a showerhead assembly 46 can be positioned in the cooling station 20 directly opposite the gas outlet assembly 36. The gas outlet assembly 36 is located adjacent the upper wall 24a of the handling chamber 22 and the showerhead assembly 46 is supported on the shelf, or wafer station floor, 24d. Together with the upper wall 24a, the gas outlet assembly 36 constitutes a ceiling for the wafer station 20. In addition, just as the gas outlet assembly 36 has a gas inlet 42, the showerhead assembly 46 has a gas inlet 48 that is connected to a suitable source of gas (not shown). Advantageously, by this arrangement, substrate cooling can be accelerated by directing cooling gas to both major horizontal surfaces of the substrate 38, i.e., by gas flows 58 and 60 to the top surface 38a and gas flow 47 to the bottom surface 38b.

Figure 3C:
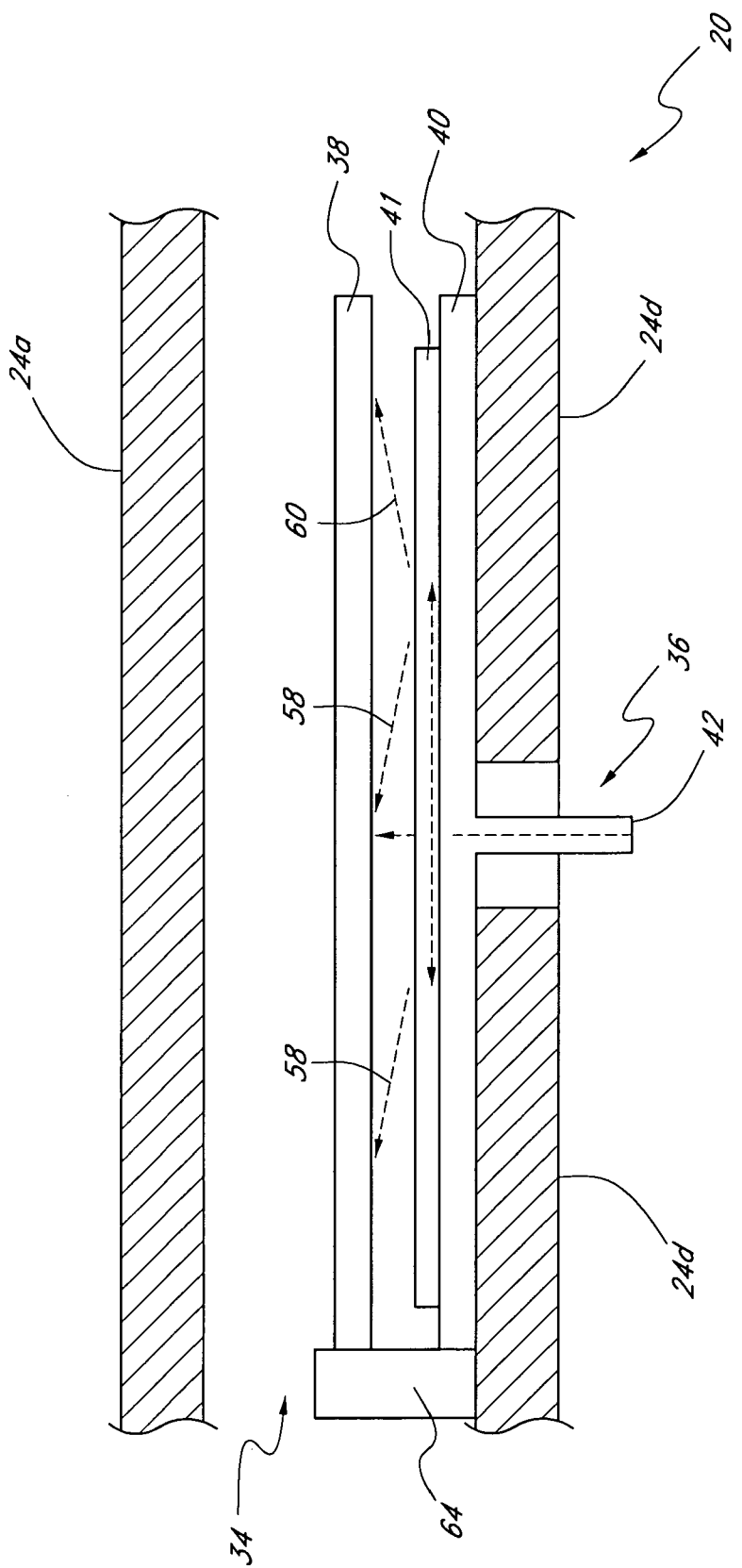

In other arrangements, as shown in FIG. 3C, the gas outlet assembly 36 can be located beneath the substrate 38. Flowing gas out of the gas outlet assembly 36 in accordance with the Bernoulli principle advantageously provides a cushion of gas to vertically suspend the substrate 38 while, as discussed below, also providing a force to maintain the substrate 38 centered over the gas outlet assembly 36. The flow rate of the gas is chosen sufficient to produce the cushion of gas; advantageously, the flow rate in this arrangement typically need not be altered relative to the gas flow rate used when a gas outlet assembly 36 is located directly above a substrate 38. While not shown, a showerhead can also be provided above the substrate 38.

It will be appreciated that the gas outlet assembly 36 is provided with gas outlets that emit gas to a substrate at angles, to suspend the substrate in the wafer station 20. The gas flow angle and flow rate are chosen such that, flowing across a major surface of the substrate, the gas flow causes an area of decreased pressure for enabling the Bernoulli Principle to be used to hold the substrate suspended in the cooling station 20 without physical contact with support structures. Advantageously, the gas can be any gas compatible for use in semiconductor processing systems, preferably including but not limited to inert gases such as nitrogen, argon, helium, neon, etc. More preferably, for cooling the substrate, the gas flowing over the substrate is a highly thermally conductive inert gas, such as helium or argon.

Figure 4:
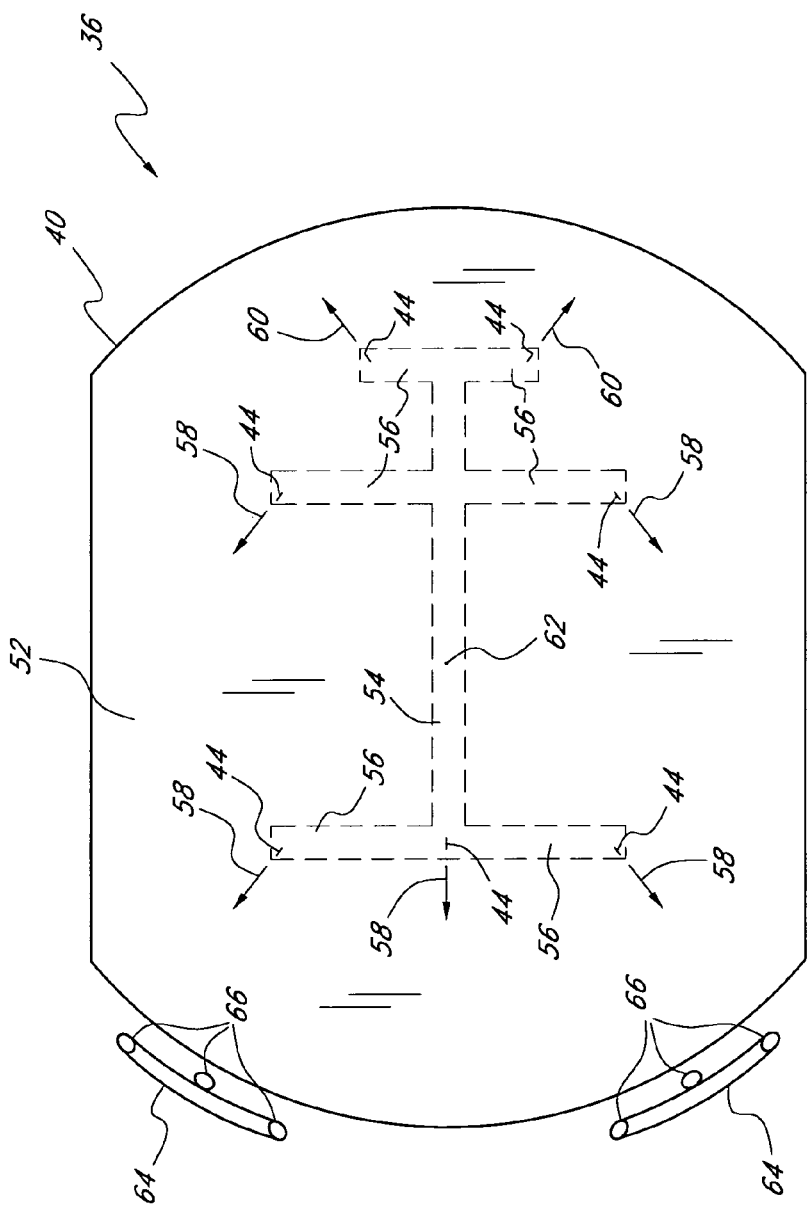
FIG. 4 is a plan view, in isolated, of a horizontal surface of the wafer station of FIGS. 3A and 3B, in accordance with preferred embodiments of the invention.

One exemplary arrangement of gas outlets is shown in FIG. 4. FIG. 4 is a plan view of the gas outlet assembly 36, with the gas outlets 44 and 62 and gas channels 54 and 56 for transporting gas to the gas outlets 44 and 62 schematically illustrated. It will be appreciated that the surface 52 is oriented so that it faces the substrate 38, when the substrate 38 has been loaded into the cooling station 20. Under the surface 52, the gas channel 54 is formed between the base 40 (FIGS. 3A–3C) and the plate 41, and is preferably formed by a channel machined into one or the other or both of the base 40 and the plate 41. The gas channel 54 extends along a first axis along the surface 52, and communicates with a gas source (not shown) through the gas inlet 42. The extension of the first axis in one arbitrary direction can be considered an extension forwardly along the axis and the extension in the opposite direction can be considered an extension rearwardly along the axis.

A plurality of transverse gas passages 56 intersects the gas channel 54 to provide gas flow to various parts of the area on either side of the gas channel 54. A number of gas outlets 44 extend from both the gas channel 54 and the transverse gas passages 56 to the surface 52 of the gas outlet assembly 36 facing the wafer space 34. The gas outlets 44 provide the Bernoulli flow for suspending substrates, as discussed above.

The flow of lifting gas proceeds from the gas inlet 42 to the gas channel 54 and continues into the transverse gas passages 56. The gas is preferably distributed at a uniform pressure throughout the channel 54 and passages 56 and exits from the gas outlet assembly to provide a uniform and efficient lifting velocity. Specifically, some of the gas outlets 44 are angled to provide gas flow such as indicated at 58, while other of the gas outlets are angled as indicated by the flow arrow 60 to provide flow in a generally opposite direction. As illustrated, the flow of gas is preferably radially outward from the approximate center of gas outlets 44 so as to provide a continuous outwardly sweeping air flow for keeping particles off the top surface of the wafer while simultaneously providing the area of decreased pressure for enabling the Bernoulli Principle to be used to lift or pick up the wafer without physical contact. In addition, a central gas outlet 62 is preferably provided extending perpendicularly to the surface of the plate 41. The central gas outlet jet 62 advantageously provides an additional gas flow to sweep out particulates which might otherwise flow into the reduced pressure region directly adjacent the plate 41. Suitable sweep jets are discussed in U.S. Pat. No. 5,080,549 to Goodwin, et al., the disclosure of which is herein incorporated by reference in its entirety.

Preferably, the number of gas outlets 44 angled as indicated by 58 outnumber the number angled as indicated by 60, to induce a slight force on the levitated wafer 38 (FIGS. 3A–3C) in the direction of the stop element 64. In other embodiments, larger gas outlets 44 angled as indicated by 58 can be provided to accomplish the same result. By slightly directing the substrate 38 to contact the stop elements 64, which prevents the substrate 38 from further drifting in the direction of the flow 58, the substrate 38 can be kept centered under the gas outlets 44. The wafer stop elements 64 are curved to conform to the shape of the wafer in the cooling station 20, and have a plurality of stop pegs 66 which can directly contact sides of the substrate. Preferably, there are three such stop pegs 66 distributed along the arc of each stop element 64.

In addition, the stop elements 64 are preferably positioned opposite the opening of the cooling station 20 through which the substrate 38 enters the cooling station 20. In this arrangement, the stop elements 64 do not interfere with the movement of the substrate 38 into and out of the cooling station 38. It will be appreciated, however, that the stop elements 64 can be positioned at other locations, so long as there is no interference with the movement of the substrate 38 into and out of the cooling station 20. In addition, to prevent being damaged by a hot substrate 38, the stop elements 64 are preferably formed of quartz, or other high temperature resistant material, including non-scratching materials such as Teflon®.

Further details regarding one exemplary embodiment of the wafer station 20 are described below. As illustrated in FIG. 4, at least three gas outlets 44 are located on either side of the gas channel 54. In the illustrated embodiment, seven gas outlets 44 and one central gas outlet 62 are located in the plate 41 of the gas outlet assembly 36. The gas outlets 44 and central gas outlet 62 each have a diameter of about 0.019 inch ± about 0.001 inch. In addition, in contrast to the more generally vertical gas jets of standard showerheads, the gas outlet holes 44 are oriented at an angle of about 30° ± about 1° relative to a plane formed by the gas outlet holes 44, e.g., relative to the surface 52 of the gas outlet assembly 36 in the illustrated embodiment. The central gas outlet hole 62 is oriented perpendicular to the surface 52. The flow rate of gas through each gas outlet 44 is about 7 to 10 slm, with a total aggregate flow of gas out of all gas outlets 44 being about 60 to 70 slm. Four gas outlets 44 are located laterally of the axis 54 and are oriented to discharge gas in the direction 58. An additional gas outlet 44 is located coincident with and rearwardly along the axis 54 and also discharges gas as indicated by 58. Two gas outlets 44 are located laterally of and forwardly along the axis 54 and are oriented to discharge gas in the opposite direction, as indicated by 60. It will be appreciated that the rate of cooling of the substrate can be altered by increasing or decreasing the rates of flow of gas across the substrate's surface. It will also be appreciated that the cooling rate can be further increased by use of a showerhead to flow cooling gas to the substrate from the side of the substrate opposite the gas outlet assembly 36. As discussed earlier, the cooling gas can including, e.g., nitrogen, argon, helium and hydrogen. Moreover, the exact number and size of the gas outlets can vary, depending, for example, upon the size of the wafer.

Figure 5:
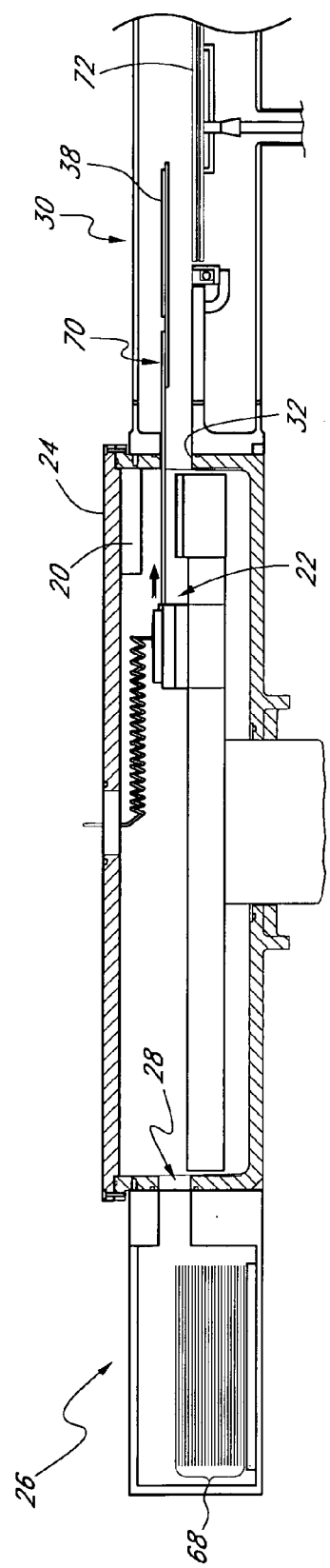
FIG. 5 is a side cross-sectional, schematic view of a semiconductor processing system with one form of a wafer handler that can be used with the wafer station, in accordance with preferred embodiments of the invention.

With reference to FIG. 5, the substrate 38 is preferably transported into the cooling station 20 after processing in the processing chamber 30. After being cooled to a temperature low enough for the substrate 38 to be received in commonly available relatively low-cost wafer cassettes, preferably about 60° C. or less, the substrate 38 is transported out of the cooling station 38 to the load/unload chambers 26, which can contain wafer cassettes 68 for storing the substrates 38. The pick-up arm 70 preferably picks up the wafer 38 off the rotatable susceptor 72 in the processing chamber 30, on which the wafer 38 can undergo semiconductor processing, and transports the wafer 38 to the cooling station 20. While illustrated with the wafer handling chamber 24 directly adjacent to the processing chamber 30 and the load/unload chambers 26, it will be appreciated that the substrate can travel through various other chambers, such as load lock chambers, that intervene between the processing chamber 30 and the load/unload chambers 26 in other arrangements. In yet other arrangements, the wafer station 20 can be a stand-alone station located adjacent to the illustrated CVD apparatus. The skilled artisan will appreciate that, while described as a cassette for ease of discussion and illustration, reference numeral 68 can be any structure, e.g., a cassette, a FOUP or a boat, for storing wafers.

The wafer handler 22 and pick-up arm 70 for transporting the substrate 38 to and from the cooling station 20 can be any of the various substrate handling systems known in the art, some non-limiting examples of which are discussed below. As discussed earlier, one type of substrate pick-up device, known as a Bernoulli wand, flows gas downward from the wand toward the wafer that then radially outward to create a region of lower pressure between the wafer and the wand, thereby lifting it. The Bernoulli wand advantageously avoids contact with the wafer, except, perhaps, at one or more small edge locators. One type of Bernoulli wand is shown in U.S. Pat. No. 5,080,549 to Goodwin, et al. Advantageously, in an embodiment where the cooling station gas outlets are located underneath a wafer 38 (FIG. 3C), the use of a Bernoulli wand to handle the wafer 38 allows the wafer 38 to be transported and cooled or staged without being directly contacted, other than with the aforementioned edge locators or stop elements 64 (FIG. 4). In addition to transporting the substrate 38 to and from the cooling station 20, a Bernoulli wand can advantageously elevate, transport the wafer 38 out of the process chamber 30 and start cooling at the station 20 of FIG. 3C while it is still at very high temperatures.

Another type of wafer pick-up wand utilizes a vacuum force and, thus, must be in intimate contact with the wafer. U.S. Pat. No. 4,566,726 to Corentti, et al. discusses a combination of Bernoulli and vacuum pick-up devices.

Yet another type of wafer pick-up device is a simple paddle or, preferably, a fork, both of which lifts and supports wafers from underneath. Many suitable paddles or forks are known in the art, with particular non-limiting examples of paddles or forks described below.

One exemplary paddle is illustrated in U.S. Pat. No. 4,951,601 to Maydan, et al. That patent also illustrates a typical movement device for translating wafers from location to location within processing systems. The wafer handler is capable of linear retraction and extension, as well as rotation about an axis. U.S. Pat. No. 5,135,349 to Lorenz, et al., discloses a robotic handling system using two paddle-type pick-ups mounted on a common rotating base. Both pick-ups are adapted to extend linearly away from one another to speed handling of wafers within the processing system. The paddles are augmented with a vacuum generated through a plurality of holes in an end effector portion of each paddle; the vacuum being transmitted along a channel within the paddle. Consequently, it will be appreciated that any of these or other wafer handling systems known in the art can be modified or adapted for use with the cooling station 20.

To transport a wafer 38 into or out of the processing chamber 30, the wafer handler 22 can be rotated to be aligned with the process chamber 30. Generally, after processing, the wafer is too hot to transfer directly to the load/unload chamber 26. Instead, the wafer handler is rotated a small distance to align with one of the cooling stations. The pick-up arm 70 is then extended to place the hot wafer 38 into the cooling station 20. The flow of gas out of the gas outlets 44 (FIG. 4) then generates a low pressure region proximate the face of the wafer 39 facing the gas outlet assembly 36 to draw the wafer 38 towards the gas outlet assembly 36 without directly contacting the gas outlet assembly 36. The pick-up arm 70 can then be retracted. Inside the cooling station 20, the wafer 38 can be cooled by the flow of gas across one or more of its surfaces.

While the first wafer is being cooled, a second wafer can be positioned into the process chamber. This second wafer may be retrieved from the cassette 68 and transferred to the processing chamber 30, or the second wafer may have been positioned into the second cooling station while the first wafer was being processed. In that case, the handler only has to be rotated a short distance (about 100°) from the first cooling station 20 to align the wand with the second cooling station to withdraw a second wafer, and then rotate back (about 50°) to the position where the second wafer can be inserted into the process chamber 30. The second cooling station in that situation is serving as a staging area. After the second wafer has been placed into the process chamber 30, the first wafer 38 can be removed from the first cooling station 20 and returned to the storage area 26, assuming it has been adequately cooled by then. Immediately after placing a processed wafer 38 into the storage area, a third wafer can be withdrawn from the cassette 68 and moved to one of the cooling/staging stations to await its turn to be placed in the process chamber 30. From the foregoing, it can be appreciated that great flexibility is provided in the handling of the wafers so that the wafers can be moved in various sequences to fit with the temperatures and times of the processes being used by the system and with the time required to cool the particular wafers to the temperature desired before returning the wafer to the standard cassette 68.

Based on the foregoing, it will be appreciated that the wafer station advantageously allows a wafer to be cooled without having to rest on pins or other support structures. As such, the wafer station desirably prevents scratching of the wafer's bottom surface, as can happen when the bottom surface rests directly on a support structure.

It will also be appreciated that although this invention has been described on the basis of particular preferred embodiments, modifications of the invention are possible and are within the spirit and scope of this disclosure. For example, while a single process chamber has been illustrated and discussed, a so-called cluster system could be employed wherein additional process chambers may be clustered around the wafer handler. With the arrangement shown at least two additional chambers could be provided. Consequently, these and various other omissions, additions and modifications may be made to the processes described above without departing from the scope of the invention, and all such modifications and changes are intended to fall within the scope of the invention, as defined by the appended claims.

We claim:

1. A semiconductor wafer cooling station, comprising:
   an upper horizontal surface;
   a lower horizontal surface, wherein the lower horizontal surface and the upper horizontal surface define a wafer space configured to accommodate the semiconductor wafer; and
   an immobile cooling assembly, the cooling assembly having a plurality of gas outlets configured to exhaust a gas onto a face of the wafer;
   wherein the cooling assembly is configured to suspend the wafer by the Bernoulli principle utilizing the plurality of gas outlets, with both faces of the wafer vertically separated from the upper and the lower horizontal surfaces.

2. The cooling station of claim 1, wherein the gas outlets are in gas communication with an inert gas source.

3. The cooling station of claim 2, wherein the inert gas source contains nitrogen gas.

4. The cooling station of claim 2, wherein the inert gas source contains a highly thermally conductive gas.

5. The cooling station of claim 4, wherein the thermally conductive gas comprises helium.

6. The cooling station of claim 4, wherein the thermally conductive gas comprises argon.

7. The cooling station of claim 1, wherein the cooling assembly provides gas flow through the upper horizontal surface to the wafer space.

8. The cooling station of claim 7, further comprising a showerhead to provide gas flow through the lower horizontal surface to the wafer space.

9. The cooling station of claim 1, wherein the cooling assembly provides gas flow through the lower horizontal surface to the wafer space.

10. The cooling station of claim 1, wherein each of the gas outlets is configured to emit the gas at an angle to create a low pressure region adjacent to the face of the wafer, in accordance with the Bernoulli principle.

11. A method of cooling a hot substrate that has been subjected to high temperatures in a chamber, comprising:
   removing the hot substrate from the chamber with a substrate handler;
   transferring the hot substrate into a stationary cooling station using the substrate handler;
   vertically suspending the substrate inside the cooling station in accordance with the Bernoulli principle by flowing a gas to create a low pressure zone across a horizontal surface of the substrate; and
   withdrawing the handler from the cooling station; and convectively cooling the substrate by flowing the gas.

12. The method of claim 11, wherein the gas comprises a highly thermally conductive gas.

13. The method of claim 12, wherein the thermally conductive gas comprises helium.

14. The method of claim 12, wherein the thermally conductive gas comprises argon.

15. The method of claim 11, wherein convectively cooling the substrate further comprises flowing a gas to a side of the substrate opposite the horizontal surface.

16. The method of claim 11, wherein convectively cooling the substrate comprises reducing a temperature of the substrate to about 60° C. or less.

17. The method of claim 16, further comprising transporting the substrate to a wafer cassette after reducing the temperature of the substrate.

* * * * *

UNITED STATES PATENT AND TRADEMARK OFFICE
CERTIFICATE OF CORRECTION

PATENT NO. : 6,883,250 B1
DATED : April 26, 2005
INVENTOR(S) : Ravinder Aggarwal and Bob Haro It is certified that error appears in the above-identified patent and that said Letters Patent is hereby corrected as shown below:

Column 10,
Line 40, please delete "wafer;" and insert -- wafer, --, therefor.

Signed and Sealed this

Twenty-seventh Day of September, 2005

JON W. DUDAS
*Director of the United States Patent and Trademark Office*